United States Patent [19]
Lee

[11] Patent Number: 6,101,135
[45] Date of Patent: Aug. 8, 2000

[54] SEMICONDUCTOR MEMORY DEVICE AND DATA PROCESSING METHODS THEREOF

[75] Inventor: Young-Dae Lee, Seoul, Rep. of Korea

[73] Assignee: Samsung Electronics, Co., Ltd., Suwon, Rep. of Korea

[21] Appl. No.: 09/313,872

[22] Filed: May 18, 1999

[30] Foreign Application Priority Data

May 18, 1998 [KR] Rep. of Korea ...................... 98-17779

[51] Int. Cl.[7] .................................................. G11C 7/00
[52] U.S. Cl. ..................... 365/191; 365/194; 365/189.01; 365/238.02
[58] Field of Search .................................... 365/191, 194, 365/189.01, 230.02, 230.01, 189.04, 189.07

[56] References Cited

U.S. PATENT DOCUMENTS

| | | | |
|---|---|---|---|
| 4,998,221 | 3/1991 | Correale, Jr. ....................... | 365/189.07 |
| 5,371,708 | 12/1994 | Kobayashi ........................ | 365/230.01 |
| 5,612,916 | 3/1997 | Neduva .............................. | 365/189.04 |

*Primary Examiner*—Tan T. Nguyen
*Attorney, Agent, or Firm*—Marger Johnson & McCollom, P.C.

[57] ABSTRACT

A circuit for bypassing a write to semiconductor memory capable of doing so when a read operation is performed on a read address that matches the write address for write operation that is bypassed. The circuit detects patterns of a read address that matches a write address performed within the last two cycles. Depending on the type of match found, the circuit generates one or more of several bypass control signals. The current input data or input data from one of the last two cycles is selected for output responsive to the bypass control signals resulting in a bypass of writing to memory. If a bypass control signal is not selected then the input data is written to memory after the delay necessary to determine if the write operation should be bypassed.

17 Claims, 6 Drawing Sheets

SEMICONDUCTOR MEMORY DEVICE AND DATA PROCESSING METHODS THEREOF

BACKGROUND OF THE INVENTION

1. Field of the Invention

The present invention relates to a semiconductor memory device, and more particularly to a semiconductor memory device and data processing methods thereof which can perform a write operation after 1 or 2 cycles and additionally bypass an input data when write and read addresses are same while a read operation is performed after the write operation.

2. Description of the Prior Art

A conventional semiconductor memory device is designed to perform a write operation through the following processes after 1 or 2 cycles. That is, a write address input from the outside the device is first input into an address decoder while the periods of 1 or 2 cycles are delayed in the device, and then word and bit lines are selected. After the write address input, external data signals are transmitted to a write driver after a 1 or 2 cycle delay, and then the write operation is performed after this delay.

Performing the write operation after 1 or 2 cycles means that when the write address is input, the semiconductor memory device receives the write data input from the outside after the delay of 1 or 2 cycles from the input of the write address, before performing the writing operation.

The conventional semiconductor memory device can perform the writing function after 1 or 2 cycles, but cannot perform a bypassing function. That is, in a case that a write command is input 2 cycles prior to a read command, or a write is input 1 or 2 cycles prior to a read command, the conventional semiconductor memory device performs a limited bypass function by which a write data is output toward the outside thereof through a buffer without being stored in a memory cell.

However, in the conventional semiconductor device a bypass function could not be performed if a read command was input just after a write command was input, and when a write address and a read address were the same.

SUMMARY OF THE INVENTION

Accordingly, it is an object of the present invention to provide a semiconductor memory device which has various bypass functions and can perform a write operation after 1 or 2 cycles.

It is another object of the present invention to provide a data process method for operation of a semiconductor memory device having the foregoing capabilities.

In accordance with the present invention, a semiconductor memory device comprises a plurality of memory cells; a write driver for transmitting input data into the plurality of memory cells; a sense amplifier for amplifying and outputting data transmitted from the plurality of memory cells in response to a control signal of the sense amplifier; a data input buffer for buffering and outputting an external data signal; an address input buffer for buffering and outputting an external address signal; write address storage means for delaying by 1 or 2 cycles a write address input from the address input buffer to thereafter output the same address when writing after 1 or 2 cycles. A selecting means is provided for selectively outputting one of the 1 or 2 cycles-delayed write address transmitted from the write address storage means and a read address transmitted from the address input buffer. A comparison means for comparing the read address transmitted from the address input buffer and the 1 or 2 cycles-delayed write address, generates first and second comparison signals when the two addresses are identified as being identical. A bypass control signal generating means is provided for generating bypass 1 and bypass 12 control signals by inputting the first comparison signal while performing a write operation after the 1 cycle, and for generating bypass 0, bypass 1, bypass 2 and bypass 12 control signals by inputting the first and second comparison signals while performing the write operation after 2 cycles. A control signal generating means is included for generating the first and second control signals while performing a write operation after 1 cycle, and generating the first, second and third control signals while performing the write operation after 2 cycles. The device further includes data input storage means for generating the first, second and third signals by transmitting the 1 or 2 cycles-delayed data input signals in response to the first control signal, latching the second signal in response to the second control signal, and transmitting to the write driver by latching the third signal in response to the third control signal. A data output selecting means is provided for outputting the first signal in response to the bypass 0 control signal, outputting the second signal in response to the bypass 1 and 12 control signals, and outputting the third signal in response to the bypass 2 and 12 control signals. A data output buffer is used for output by latching the data from the data output selecting means in response to a control signal of the data output buffer in case of a write bypass operation after 1 or 2 cycles. An output enabling circuit, which includes a sense amplifier and data output buffer control signal generating means for generating a control signal to control the data output buffer, provides an enable signal to the sense amplifier.

Another aspect of the present invention is a data processing method for operation of a semiconductor memory device having a plurality of memory cells, a write driver for transmitting data to the plurality of memory cells, a sense amplifier for amplifying and outputting data being transmitted from the plurality of memory cells, a data input buffer for buffering and outputting a data input signal from the outside, an address input buffer for buffering and outputting an address input signal from the outside, and a data output buffer for buffering and outputting data being output from the sense amplifier in response to a control signal of the data output buffer. The method comprises the steps of: (1) delaying 1 cycle to output a write address from the address input buffer, in case of write operation after 1 cycle; generating bypass 1 and bypass 12 control signals when the write address and a read address, in case of a read command being input, are compared with one another and identified as being equal; delaying by 2 cycles to output a write address from the address input buffer, in case of write operation after 2 cycles; and generating bypass 0, bypass 1, bypass 2, and bypass 12 control signals when a read address, in case of a read-command input, and the write address, before 1 or 2 cycles, are compared with one another and identified as being equal; and (2) generating a data input signal from the data input buffer as first, second and third signals in response to a first control signal, in case of the write operation after 1 cycle; outputting the second signal to the write driver in response to a second control signal; outputting the second signal to the data output buffer in response to the bypass 1 and bypass 12 control signals; generating a data input signal from the data input buffer as the first, second and third signals in response to the first control signal, in case of the write operation after 2 cycles; outputting the second or third signal to the write driver in response to the second or third control signal; outputting the first signal to the data output buffer in response to the bypass 0 control signal; outputting the second signal to the data output buffer in response to the bypass 1 and 12 control signals; and outputting the third signal to the data output buffer in response to the bypass 2 and 12 control signals.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF THE PREFERRED EMBODIMENT

The preferred embodiment of the present invention will now be described in detail with reference to the accompanying drawings.

Throughout the drawings, like reference numerals and nomenclature are used for designation of like or equivalent parts or portion for simplicity of illustration and explanation, a detailed description of which will be omitted.

Figure 1A:
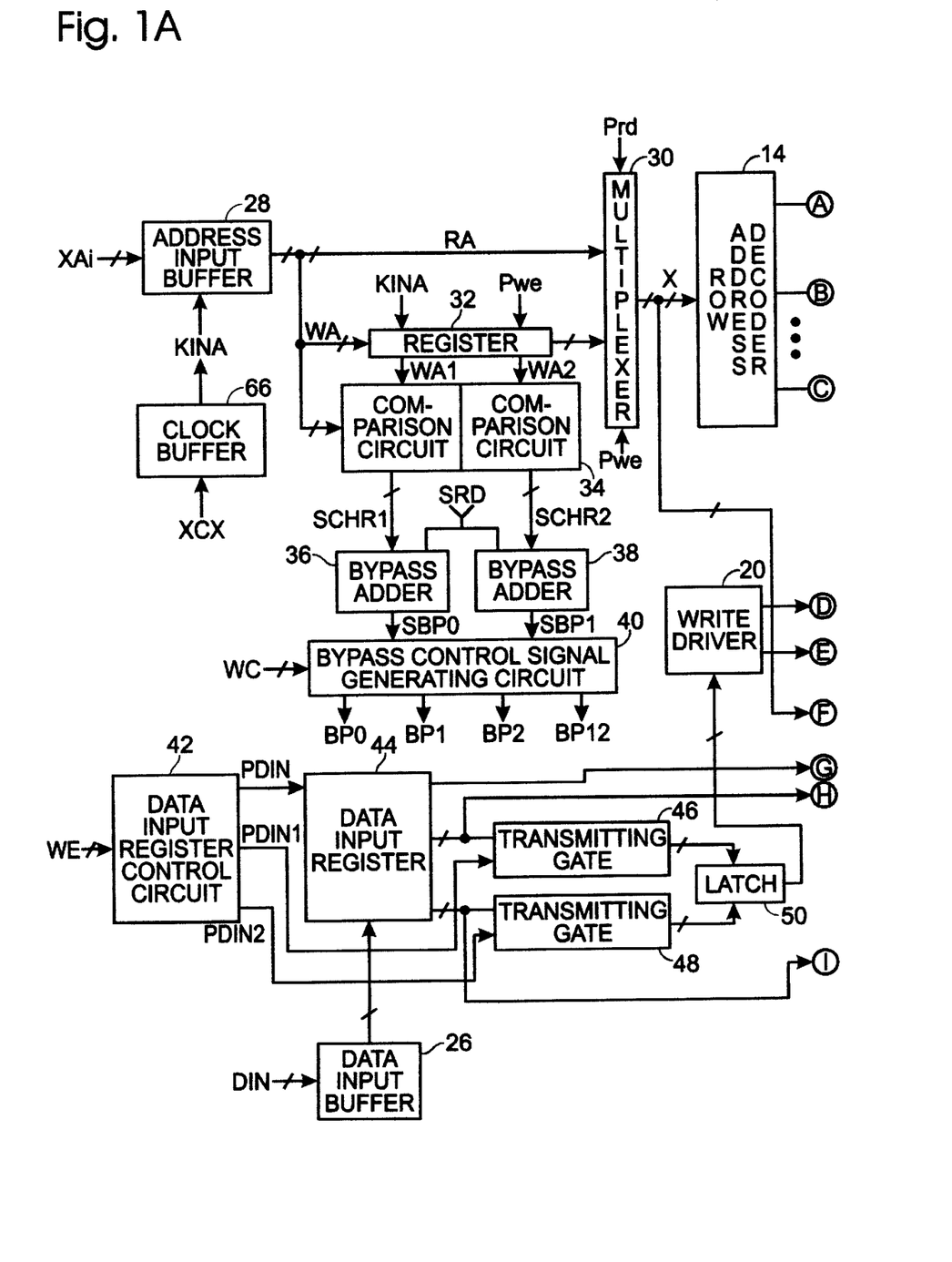
FIG. 1 is a block diagram illustrating the structure of a semiconductor memory device according to the present invention.
Figure 1B:
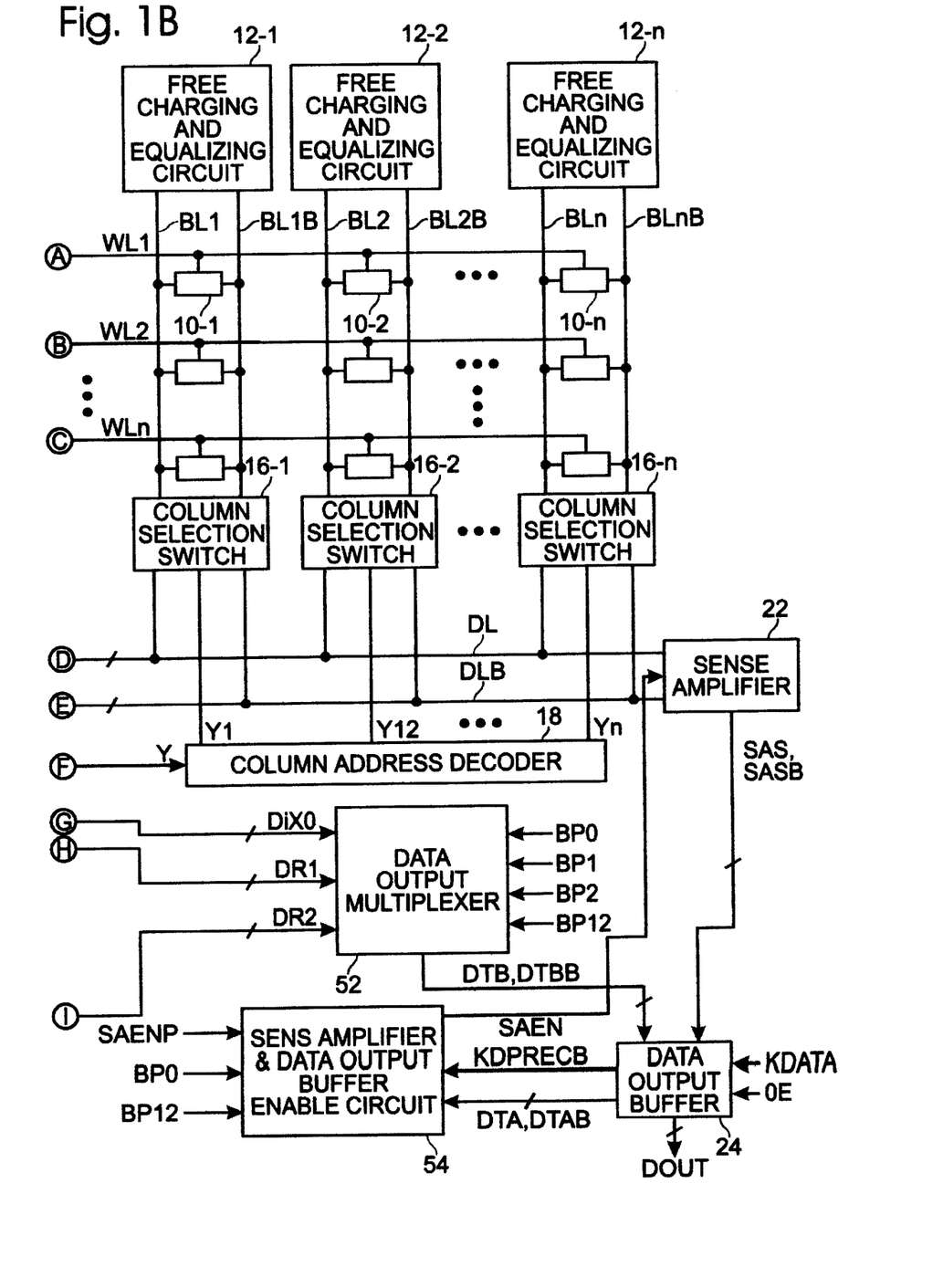

As shown in FIG. 1, illustrating the structure of a semiconductor memory device in accordance with the present invention, the device includes memory cells 10-1, 10-2, . . . , 10-n, free charge and equalizing circuits 12-1, 12-2, . . . , 12-n, a row address decoder 14, column selection switches 16-1, 16-2, . . . , 16-n, a column address decoder 18, a write driver 20, a sense amplifier 22, a data output buffer 24, a data input buffer 26, an address input buffer 28, a multiplexer 30, a register 32, a comparison circuit 34, bypass integrators 36 and 38, a bypass control signal generating circuit 40, a data register control circuit 42, a data input register 44, transmitting gates 46 and 48, and a latch 50.

Now, the operation of the semiconductor memory device thus constructed will be described in the following.

The memory cells 10-1, 10-2, . . . , 10-n serve to write data of bit line pairs BL1, BL1B, BL2, BL2B, . . . , BLn, BLnB selected in response to word line selection signals WL1, WL2, WLn and column selection signals Y1, Y2, . . . , Yn, or read data from bit line pairs. The free charging and equalizing circuits 12-1, 12-2, . . . , 12-n serve to free-charge and equalize the bit line pairs while executing a read operation.

The row address decoder 14 serves to decode a row address X to generate the word line selection signals. The column selection switches 16-1, 16-2, . . . , 16-n control transmitting data between bit line pairs and data line pairs DL, DLB in response to column selection signals Y1, Y2, . . . , Yn. The column address decoder 18 decodes a column address Y to thereby generate the column selection signals. The write driver 20 transmits data input to data line pairs. The write driver 20 does not enable while executing a read operation, so the data from the data line pair DL and DLB are not output to the write driver 20. The sense amplifier 22 amplifies data transmitted to a data line pair DL, DLB to output the data. The data output buffer 24 serves to generate an output data DOUT after buffering data.

Figure 6:
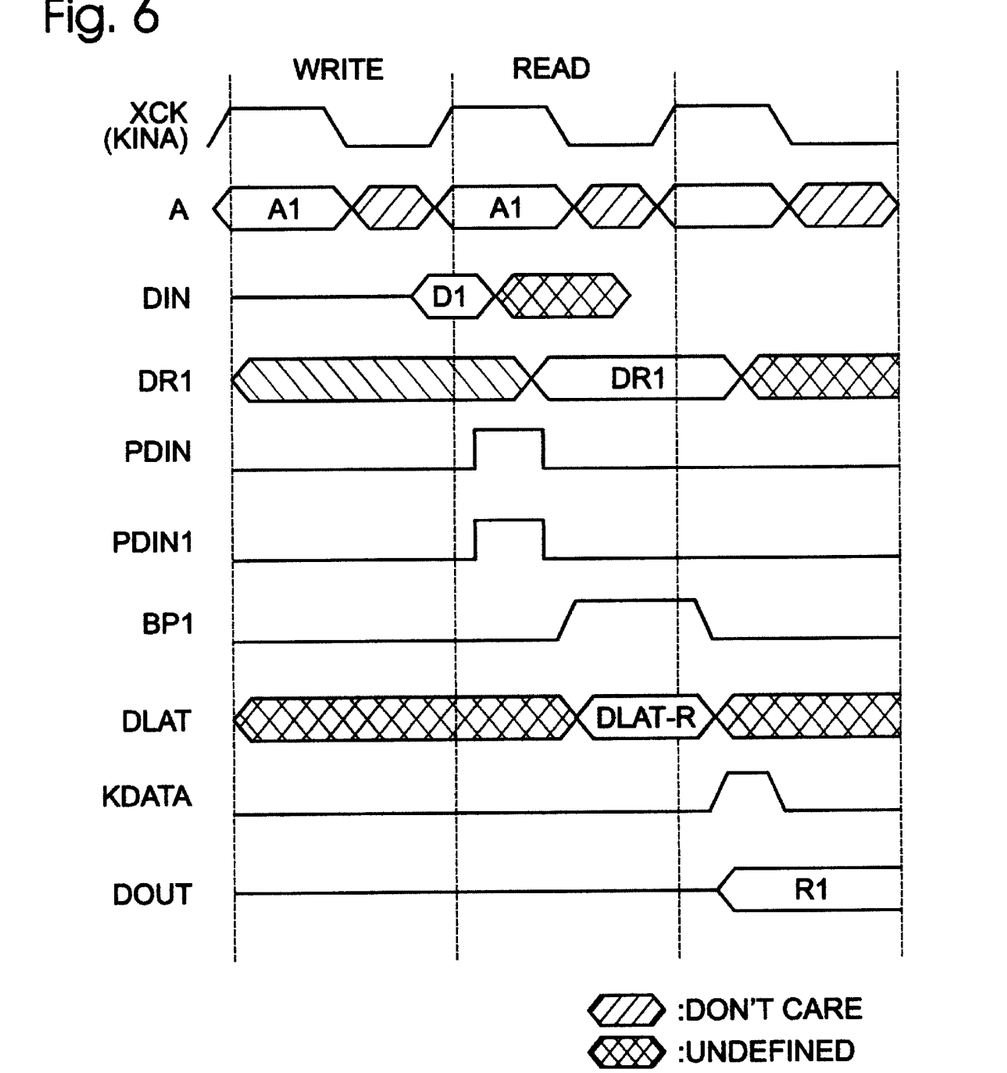
FIG. 6 is a timing diagram illustrating write bypass operation after 1 cycle in the device as illustrated in FIG. 1.
Figure 7:
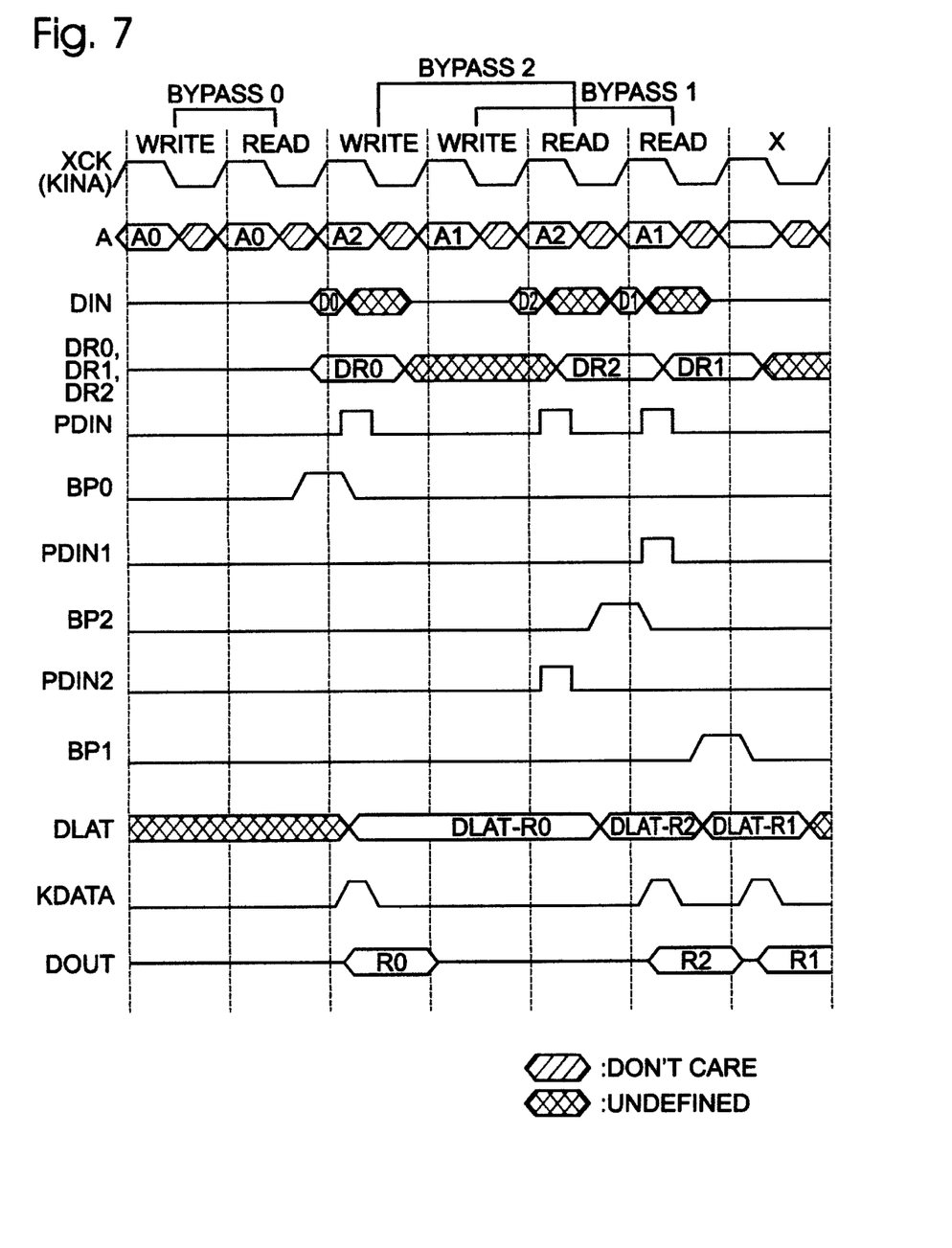
FIG. 7 is a timing diagram illustrating write bypass operation after 2 cycles in the device as illustrated in FIG. 1.

The data input buffer 26 performs buffering of data DIN input to the device. The address input buffer 28 outputs a read address RA and a write address WA after buffering an address XAi input externally, in response to a signal KINA synchronized by a clock signal XCK. Clock signal XCK is external to the invention. Clock signal XCK is buffered by clock buffer 56 and output to signal KINA. In FIGS. 6 and 7, the timing diagram of the clock signal XCK can be considered the same as that of the buffered clock signal KINA.

The register 32 serves to latch an output signal of the address input buffer 28, delay the same signal by 1 cycle to generate a signal WA1 in response to signals KINA, Pwe, and to delay the signal WA1 by 1 cycle to generate a signal WA2. The signal WA1 means a 1 cycle-pipe lined signal in response to the signals KINA and Pwe, and the signal WA2 means a 2 cycles-pipe lined signal in response to the signal Pwe. The signal Pwe is generated by a write enable signal and a clock signal in case of a write operation. Accordingly, the signal WA1 is output to the multiplexer 30 in a write operation after the lapse of 1 cycle and the signal WA2 is output to the multiplexer 30 in a write operation after the lapse of 2 cycles.

The multiplexer 30 outputs a read address RA in response to a signal Prd, and outputs a write address output from the register 32 in response to the signal Pwe. The signal Prd is generated by a read enable signal and a clock signal, in a read operation.

The comparison circuit 34 serves to generate a signal SCHR1 when the signal WA1 and a read address are compared and identified as being equal, and to generate a signal SCHR2 when the signal WA2 and a read address are compared and identified as being equal. The bypass adder 36 generates a signal SBP0 by adding a read signal SRD and the signal SCHR1.

The bypass adder 38 generates a signal SBP1 by adding the read signal SRD and the SCHR2. The bypass control signal generating circuit 40 generates bypass control signals BP0, BP1, BP2, BP12 in response to the write enable signal, including generating the first bypass signal BP1 in case of write operation after 1 cycle, and generating the corresponding bypass control signals in case of a write operation after 2 cycles. That is, signal BP0 is generated when the bypass 0 operation is performed; the BP1 and BP12 signals are generated in case of the bypass 1 operation being performed; and the BP2 and BP12 signals are generated in case of the bypass 2 operation.

The data input register control circuit 42 generates control signals PDIN, PDIN1 and PDIN2 from input of a write enable signal WE. The data input register control circuit 42 generates the signal PDIN synchronized by a clock signal after 1 cycle of write operation when performing a write operation after 1 cycle, and generates the signal PDIN1 when a read command is input after 1 cycle of write operation. In addition, the data input register control circuit 42 generates the signal PDIN2 synchronized by a clock signal after 2 cycles of write operation when performing a write operation after 2 cycles, generates the signal PDIN1 when a read command is input prior to 2 cycles and after 1 cycle of write operation, and generates the signal PDIN2 when a write command is input before 1 cycle and 2 cycles.

The data input register 44 transmits and latches the data input signal DIN in response to the signal PDIN to output signals DR0, DR1 and DR2 to the data output multiplexer 52. The transmitting gate 46 transmits the signal DR1 in response to the signal PDIN1.

The transmitting gate 48 transmits the signal DR2 in response to the signal PDIN2. The latch 50 serves to latch output signals of the transmitting gates 46 and 48 to the write driver 20. The multiplexer 52 outputs one of the signals DR0, DR1 and DR2 as signals D and DT to the output buffer 24 in response to the bypass control signals BP0, BP1, BP2 and BP12.

In the structure of FIG. 1, the register 32, comparison circuit 34, bypass adders 36 and 38, and bypass control signal generating circuit 40 designate the address compare bypass enabling circuit. The data input register control circuit 42, data input register 44, transmitting gates 46 and 48, latch 50 and data output multiplexer 52 designate the bypass control circuit.

Figure 2:
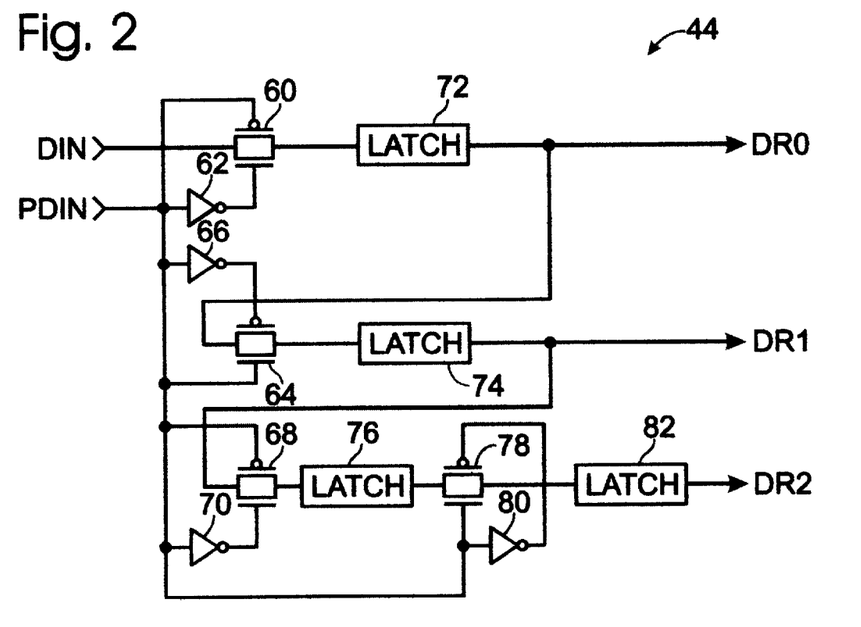
FIG. 2 is a circuit diagram illustrating the structure of a data input register of the device as illustrated in FIG. 1.

FIG. 2 shows a circuit diagram illustrating the data input register 44 of the semiconductor memory device according to the present invention, in which inverters 62, 66, 70 and 80, transmitting gates 60, 64, 68 and 78 and latches 72, 74, 76 and 82 are included.

The transmitting gates 60 and 68 serve to transmit the data input signal DIN and signal DR1, respectively, in response to the signal PDIN which is at a "low" level. The latches 72 and 76 serve to latch signals transmitted through the transmitting gates 60 and 68. The transmitting gates 64 and 78 serve to transmit signals latched by the latch 76 and the signal DR0, respectively, in response to the signal PDIN which is at a "high" level. The latches 74 and 82 serve to latch signals transmitted through the transmitting gates 64 and 78, respectively.

In the circuit as illustrated in FIG. 2, data input signal DIN and data stored in the latches 74 are respectively transmitted to the transmitting gates 60 and 68 in response to PDIN which is at a "low" level, and data stored in the latches 72 and 76 are transmitted to the signals DR1 and DR2 in response to PDIN at a "high" level.

The circuit in FIG. 2 serves to output one of the signals DR0, DR1 or DR2 to the data output multiplexer 52 for the case of performing the bypass 0, bypass 1 and bypass 2 functions. The bypass 0 function indicates a case where the read command of the same address is input after a write command is input. The bypass 1 function indicates a case where write, read, read commands are performed consecutively and the write address and the last read address are the same. The bypass 2 function means a case that write, write, read commands are performed consecutively and the first write address and the read address are the same.

Referring back to FIG. 1, the transmitting gate 46 transmits the signal DR1 in response to the signal PDIN1, and the transmitting gate 48 transmits the signal DR2 in response to the signal PDIN2. The latch 50 serves to latch signals being output from the transmitting gates 46 and 48 to thereafter output the same to the write driver 20. That is, the latch 50 and the transmitting gates 46 and 48 receiving the signals DR1 and DR2 are circuits for performing a write operation after 1 cycle or 2 cycles.

Figure 3:
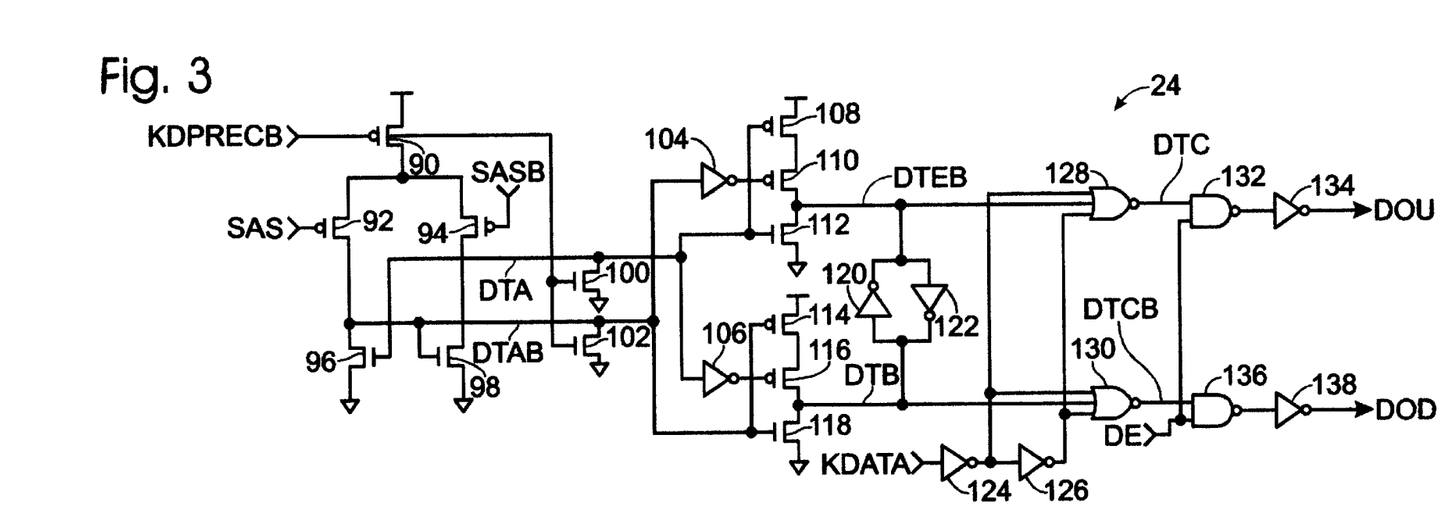
FIG. 3 is a circuit diagram illustrating the structure of a data output buffer of the device as illustrated in FIG. 1.

FIG. 3 shows the circuit of the data output buffer 24 of the semiconductor memory device according to the present invention. The circuit includes PMOS transistors 90, 92, 94, 108, 110, 114 and 116, NMOS transistors 96, 98, 100, 102, 112 and 118, inverters 104, 106, 120, 122, 124, 126, 134 and 138, NOR gates 128 and 130, and NAND gates 132 and 136, arranged as shown in FIG. 3 and operating as follows.

In the enable circuit having PMOS transistor 90, 92 and 94 and NMOS transistor 96, 98, 100 and 102, when an enable signal KDPRECB is at a "high" level while a write operation is performed, the PMOS transistor 90 is turned off and the NMOS transistors 100, 102 are turned on, thereby allowing the data signals DTA and DTAB to be maintained at "low" levels.

In addition, when the enable signal KDPRECB is at a "low" level, when performing a read operation, the PMOS transistor 90 is turned on and the NMOS transistors 100, 102 are turned off, so that signals SAS and SASB output from the sense amplifier 22 are transmitted to the data line pairs DTA and DTAB, respectively.

In the circuit including inverters 104 and 106, PMOS transistors 108, 110, 114 and 116, NMOS transistors 112 and 118, and inverters 120 and 122, all of the data line pairs DTA and DTAB are at "low" levels while the circuit performs a write operation. All of the PMOS transistors 110, 116 and NMOS transistors 112, 118 are turned off accordingly so that data latched by the inverters 120 and 122 are maintained in the data line pairs DTBB and DTB. Signals D and DT from the data output multiplexer 52 are input to data line pairs DTB and DTBB respectively at this point. In the case of a read operation, data transmitted to the data line pairs DTA and DTAB are inverted and thereby transmitted to the data line pairs DTB and DTBB.

The circuit having inverters 124 and 126 and the NOR gates 128 and 130 allows data to be inverted, which are transmitted to the data line pairs DTBB and DTB by the signal KDATA synchronized by the clock XCK, and to be output to the data line pairs DTC and DTCB. That is, when the signal KDATA is changed from a "low" level to a "high" level, the circuit allows data transmitted to the data line pairs DTBB and DTB to be inverted and transmitted to the data line pairs DTC and DTCB.

The circuit having the NAND gates 132 and 136 and the inverters 134 and 138 serves to transmit output signals to the data line pairs DTC and DTCB in response to an output enable signal OE, to form the data output signals DOU and DOD.

The data output buffer 24, as shown in FIG. 3, is a circuit structure enabling the write bypass operation after 1 cycle or 2 cycles.

Figure 4:
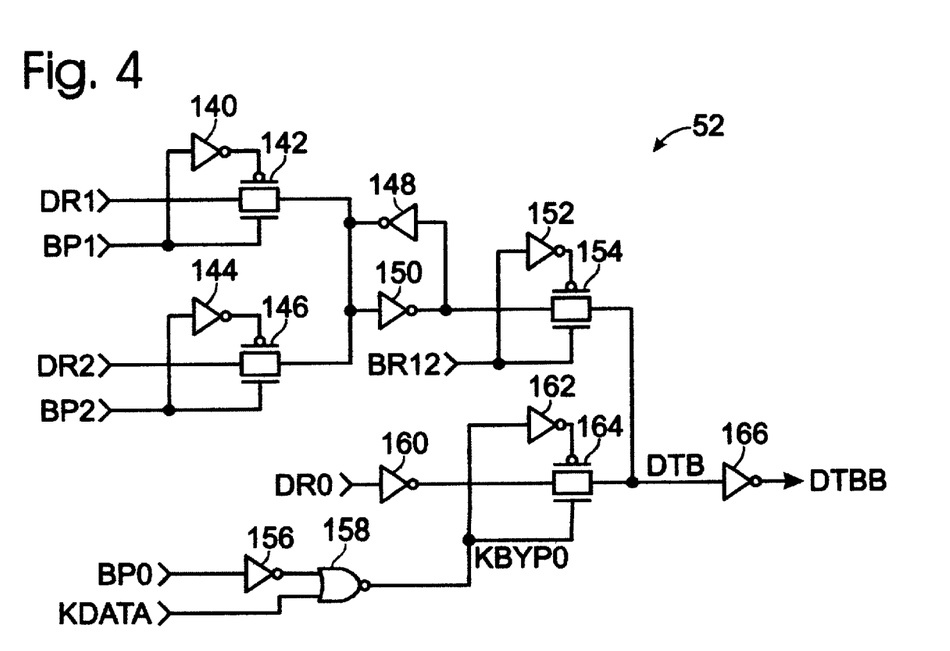
FIG. 4 is a circuit diagram illustrating the structure of a data output multiplexer of the device as illustrated in FIG. 1.

The circuit of the data output multiplexer 52 according to the present invention, as shown in FIG. 4, includes inverters 140, 144, 148, 150, 152, 156, 160, 162 and 166, transmitting gates 142, 146, 154 and 164, and a NOR gate 158.

The transmitting gates 142 and 146 serve to transmit the signals DR1 and DR2 in response to the bypass control signals BP1 and BP2. The inverters 148 and 150 serve to latch signals output from the transmitting gates 142 and 146. The transmitting gate 154 serves to transmit a signal output from the inverter 150 forming a latch in response to the bypass control signal BP12. The inverter 156 serves to invert the bypass control signal BP0. The NOR gate 158 negative-logically adds an output signal of the inverter 156 and the signal KDATA and outputs the signal KBYP0. That is, the signal KBYP0 is enabled from the bypass control signal BP0, and the signal KDATA is enabled from a "low" level to a "high" level. The inverter 160 inverts the signal DR0. The transmitting gate 164 transmits an output signal of the inverter 160 as signal D in response to the signal KBYP0, and the inverter 166 transmits signal DT. Signals D and DT are then transmitted to the data output buffer 24 as shown in FIG. 1.

Figure 5:
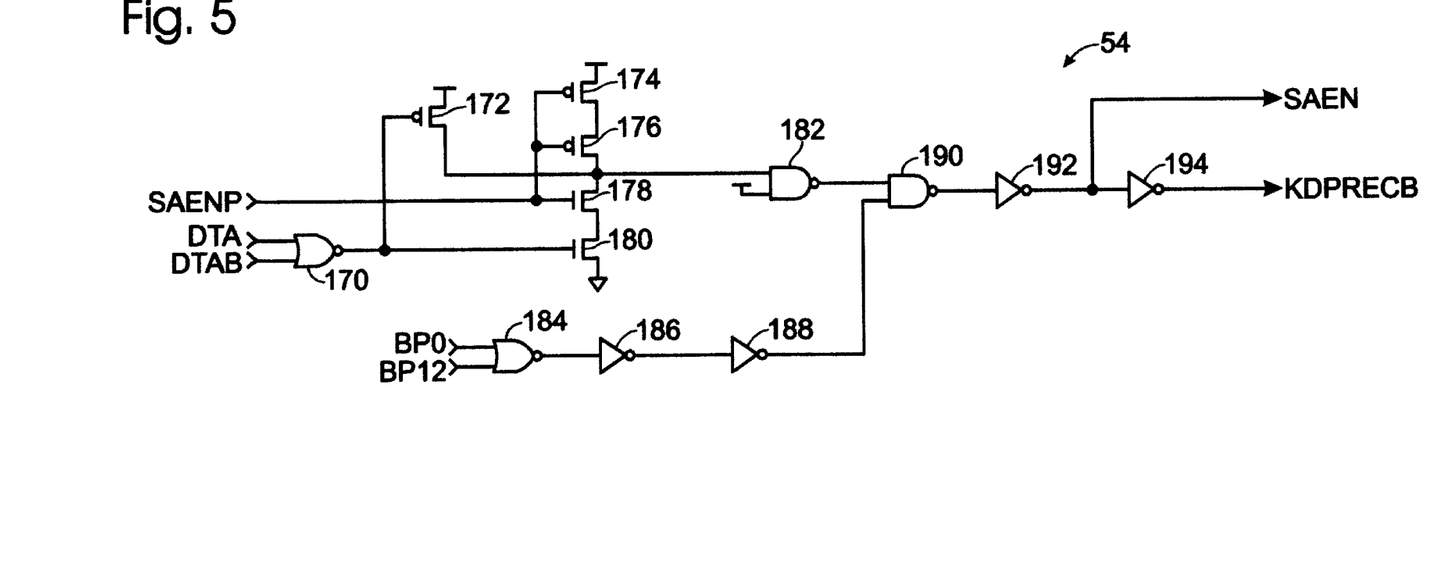
FIG. 5 is a circuit diagram for illustrating an output enabling circuit generating a signal for enabling a sense amplifier and a data output buffer as illustrated in FIG. 1.

FIG. 5 shows an output-enable circuit for generating an enable signal SAEN of the sense amplifier 22 and an enable signal KDPRECB of the data output buffer 24. The output-enable circuit includes NOR gates 170 and 184, NAND gates 182 and 190, PMOS transistors 172, 174 and 176, NMOS transistors 178 and 180, and inverters 186, 188, 192 and 194.

When a read command is input, an enable signal SAENP is generated in order to enable the sense amplifier. Enable signal SAENP is generated externally to the invention. The NOR gate 170 generates the negative-logic product of the signals output from the data line pair DTA and DTAB (see FIG. 3). That is, if all of data of the data line pairs DTA and DTAB are on "low" levels, a signal of "high" level is generated. The NMOS transistors 178 and 180 are turned on in response to the enabled signal SAENP of a "high" level and the output signal of the NOR gate 170, and allow a drain of the PMOS transistor 178 to be changed to a "low" level, when generating a signal for enabling the sense amplifier 22 and data output buffer 24.

The NAND gate 182 serves to generate the negative-logical product of the signals of a "high" level and a "low" level to thereby generate a "high" level signal. The NOR gate 184 and inverters 186 and 188 generate a "high" level signal if both of the signals BP0 and BP12 are at "low" levels, and generate a "low" level signal if at least one of the signals BP0 and BP12 is at a "high" level. That is, its structure is for enabling the operation of the data output buffer and sense amplifier in case of the bypass operation. The NAND gate 190 and inverter 192 generate a negative-logical product of the output signals of the NAND gate 182 and inverter 188, respectively, and thereafter generate the enabled signal SAEN of the sense amplifier 22 as a "high" level if both of the output signals are "high" levels, and generate a "low" level signal if at least one of the output signals is a "low" level. That is, when all of the output signals of the NAND gate 182 and inverter 188 are "high" levels, the enable signal SAEN of the sense amplifier 22 is generated as a "high" level and the enable signal KDPRECB of the output buffer is generated as a "low" level, so that operation of the sense amplifier 22 and data output buffer 24 are enabled. In addition, when the output signal of the inverter 188 is changed to a "low" level for bypass function, the NAND gate 190 generates the enabled signal SAEN of the sense amplifier as a "low" level and the enabled signal KDPRECB of the data output buffer as a "high" level, thereby disabling the operation of the sense amplifier.

Now, methods for processing data of the semiconductor device according to the present invention will be described with reference to FIG. 6. FIG. 6 is a timing diagram for illustrating a write bypass operation after 1 cycle in the semiconductor memory device according to the present invention.

The write bypass operation, after 1 cycle, is performed when the read address and write address 1 cycle before are the same and a read command after write command is generated. The operation of the sense amplifier 22 is disabled while the bypass operation is performed.

In the first cycle, if a write command is input, the address input buffer 28 serves to buffer the write address A1 to thereafter output the same. The register 32 latches the write address A1. In the second cycle, if a read command is input, the address input buffer 28 serves to buffer the read address A1 to thereafter output the same.

The comparison circuit 34 generates the signal SCHR1 when the write address, which is the output signal WA1 of register 32, and the read address are same. The bypass adder 36 serves to sum the signal SCHR1 in response to the signal SRD to thereafter output bypass signal SBP0. The bypass control signal generating circuit 40 serves to input the bypass signal SBP0 to thereby generate the signals BP1 and BP12 of the bypass 1 while performing a write operation after 1 cycle. The data input buffer 26 outputs the data input signal DIN which is input as a "low" level signal in the first cycle to the data input register 44. The data input register 44 generates the signal DR1 in response to the signal PDIN. The data output multiplexer 52 outputs the signal DR1 as signal D to the latch of the data output buffer 24 in response to the signals BP1 and BP2 of the bypass 1. The data output buffer 24 outputs the latched signal to the data output signal DOUT in response to the signals KDATA and OE.

That is, while the write bypass operation after 1 cycle is performed, the bypass control signal generating circuit 40 generates the bypass 1 signal when a read address that is the same as the write address is input in the sequence of a read command after a write command. The signal PDIN is synchronized by a clock signal after 1 cycle after a write command and thereafter is enabled, and the signal PDIN1 is enabled if a read command is input after 1 cycle of write.

In addition, when a write operation after 1 cycle is performed, the register 32 delays the output signal of the address input buffer 28 by 1 cycle to thereafter output the same to the multiplexer 30. The data input register 44 generates the data input signal DIN, which is input from the data input buffer 26 after a delay of 1 cycle, as the signal DR1 to be output in response to the signal PDIN. The transmitting gate 46 serves to latch the signal DR1 to the latch 50 in response to the signal PDIN1. As such, a write command after 1 cycle is performed.

FIG. 7 shows an operation timing diagram for illustrating the write bypass operation after 2 cycles in the semiconductor device according to the present invention.

The write bypass operation after 2 cycles is performed when a read address is the same as a write address after 1 cycle, or a read address is the same as a write address after 2 cycles. While the bypass operation is performed, operation of the sense amplifier 22 is disabled.

First, the bypass 0 operation will be described as follows.

If write command is input, in the first cycle, the write address A0 is input into the address input buffer 28 in response to the clock signal XCK of "high" level. The address input buffer 28 outputs the buffered write address A0 to the register 32. The register 32 latches the output signal of the address buffer 28 in response to the signal Pwe to thereafter output the signal WA1. In the second cycle, if a read command is input, the same read address A0 as the write address is input in response to the clock signal XCK of a "high" level. Then, the comparison circuit 34 compares the input read address A0 and the address A0 which is the output signal WA1 of the register 32 to accordingly output the signal SCHR1. The signal SCHR1 is generated for executing the bypass operation. The bypass adder 36 serves to add the signal SCHR1 to the read signal SRD and generate the signal SBP0 of a "high" level when a read command is input. The bypass control signal generating circuit 40 serves to take the signal SBP0 to thereby generate the bypass signal BP0. At this time, the data input signal DIN is not transmitted to the write driver 20, but should instead be output through the data output multiplexer 52 and data output buffer 24. In order to perform the operation, the data input signal DIN is accordingly output as the signal DR0 in response to the control signal PDIN of a "low" level after 2 cycles have lapsed. The signal DR0 is output to the data output multiplexer 52 shown in FIG. 1; the data output multiplexer 52 transmits the signal DR0 as signal D to the inverters 120 and 122 shown in FIG. 3 through the transmitting gate 164 shown in FIG. 4 in response to the bypass 0 signal BP0 and the signal KDTA. A signal DLAT-R0 is shown in FIG. 7. The data transmitted to the latch serves to generate the output signal R0 in response to the signal KDATA and the enabled signal OE.

Next, the bypass 1 operation will be explained as follows.

In the fourth cycle, if a write command is input, the write address A1 is input into the address input buffer 28 in response to the clock signal XCK of "high" level. The address input buffer 28 outputs the buffered write address A1 to the register 32. The register 32 latches the output signal of the address buffer 28 in response to the signal Pwe to thereafter generate the signal WA1. In the fifth cycle, if a read command is input, the read address A2 is input in response to the clock signal of "high" level. Then the comparison circuit 34 compares the input read address A2 and the address A0 which is the output signal WA1 of the register 32, but the signal SCHR1 is not generated because the addresses A1 and A2 are not equal. In the sixth cycle, if a read command is input, the read address A1 is input in response to the clock signal XCK of "high" level, and then data D1 of the write address A1 is input. The comparison circuit 34 compares the read address A1 and the address A1 which is the output signal WA1 of the register 32. If the comparison identifies the addresses as being equal, the comparison circuit 34 generates the signal SCHR1 . The bypass adder 36 then generates the signal SBP0 in response to the signal SRD. The bypass adder 36 generates the signal SBP0 when all bits of the signal SCHR1 are the same.

The bypass control signal generating circuit 40 generates the bypass 1 signals BP1 and BP12 when the control signal WC is identified with the bypass 1. The control signal WC is generated so that the operations of the bypass 0 and bypass 1 are distinguished from one another. That is, if a write command is input before a read command, the bypass control signal generating circuit 40 should generate the bypass 0 signal BP0, and if a read command is input before a read command, the bypass control signal generating circuit 40 should generate the bypass 1 signals BP1 and BP12.

The data input buffer 26 buffers the data DIN and then outputs it to the data input register 44. The data input register 44 generates the signals DR0, DR1 and DR2 in response to the signal PDIN. The data output multiplexer 52 transmits the signal DR1 as signal D and latches it to the inverters 120 and 122 of the data output buffer 24 shown in FIG. 3. The data output buffer 24 generates the data output signal R1 in response to the signals KDATA and OE.

In the following, the bypass 2 operation will be explained.

In the third cycle, if a write command is input, the write address A2 is input into the address input buffer 28 in response to the clock signal XCK of a "high" level. The address input buffer 28 outputs the buffered write address A2 to the register 32. The register 32 latches the output signal of the address input buffer 28 in response to the signal Pwe. In the fourth cycle, if a write command is input, the write address A1 is input in response to the clock signal XCK of a "high" level. Then, the register 32 latches the output signal of the address input buffer 28 in response to the signal Pwe. In a state of "low" level of the cycle, the data D2 of the write address A2 is input into the data input buffer 26. In the fifth cycle, if a read command is input, the read address A1 is input in response to the clock signal XCK of a "high" level. Then the register 32 generates the write addresses A1 and A2 to the output signals WA1 and WA2 in response to signal Pwe. The comparison circuit 34 compares the signals WA1 and WA2 and read address A2, identifies the address A2 as being equal to the signal W2, and generates the signal SCHR2.

The bypass adder 38 generates the signal SBP1 in response to the signal SRD. The bypass control signal generating circuit 40 receives the signal SBP1 to generate the bypass 2 signals BP2 and BP12. The data input register 44 receives the write data D2 from the data input buffer 26 to generate the signal DR0, DR1 and DP2. The data output multiplexer 52 transmits the signal DR2 as signal D to the inverters 120 and 122 of the data output buffer 24 in response to the bypass 2 control signals BP2 and BP12. The data output buffer 24 generates the data output signal R2 in response to the signals KDATA and OE.

That is, while the write bypass operation is performed after 2 cycles, the bypass control signal generating circuit 40 generates the signal BP0 in order to execute the bypass 0 operation, and generates the signals BP1 and BP12 in order to execute the bypass 1 operation, and generates the signals BP2 and BP12 in order to execute the bypass 2 operation, respectively. The bypass 12 control signal is generated together with the bypass 1 control signal, or the bypass 2 control signal.

While the write operation is executed after 2 cycles, the register 32 delays the output signal of the address input buffer 28 by 2 cycles to output the same to the multiplexer 30. The data input register 44 converts the data input signal DIN, which is input from the data input buffer 26 by being delayed by 2 cycles, to the signals DR0, DR1 and DR2 to output in response to the signal PDIN. The transmitting gate 48 latches the signal DR2 to the latch 50 in response to the signal PDIN2. The latch 50 outputs the latched signal to the write driver 20. As such, the write operation after 2 cycles is performed.

The semiconductor memory device and the methods for processing its data according to the present invention, as described in the foregoing, are processed with a bit unit.

Accordingly, the semiconductor memory device and methods for processing its data according to the present invention can execute the write operation after 1 cycle and 2 cycles, the write bypass 1 operation after 1 cycle, and the write bypass 0, 1, 2 operation after 2 cycles.

More particularly, the semiconductor memory device and methods for processing its data according to the present invention are improved by adding one of the bypass 0 and bypass 1 or 2, which is not executed in the prior art, in the write bypass operation after 2 cycles.

As is apparent from the foregoing, there is an advantage in the semiconductor memory device and methods for processing its data according to the present invention in that write function after 1 cycle and write function after 2 cycles can be executed thereby, and while read command after write is executed, various bypass write functions can be executed when a read address is equal to a write address before 1 cycle or 2 cycles.

Having illustrated and described the invention in a preferred embodiment, it will be apparent to those skilled in the art that the invention can be modified in arrangement and detail without departing from the principles thereof. We claim all embodiments coming with the scope of the following claims.

What is claimed is:

1. A semiconductor memory device comprising:
   a plurality of memory cells;
   a write driver for transmitting an input data to the plurality of memory cells;
   a sense amplifier for amplifying and outputting data transmitted from the plurality of memory cells in response to a control signal;
   a data input buffer for buffering a data signal;
   an address input buffer for buffering an address signal;
   a data output buffer;
   an address compare bypass enabling circuit for generating a delayed address signal and generating bypass control signals in response to a comparison of the address signal with the delayed address signal;
   a multiplexer for selecting either the delayed address signal or the address signal;
   a bypass control circuit for bypassing write operations to the memory by writing to the data output buffer one of a plurality of bypass data signals in response to the bypass control signals; and
   an output enabling circuit for creating a data output control signal enabling the data output buffer and disabling the sense amplifier during a bypass operation.

2. A semiconductor memory device according to claim 1, wherein the address compare bypass enabling circuit generates the delayed address signal delayed by one or two cycles.

3. A semiconductor memory device according to claim 2 wherein the address compare bypass enabling circuit comprises:
   a write address storage circuit for generating the delayed address signal from the address signal;
   a comparison circuit for comparing the address signal and the delayed address signal and generating comparison signals when the address signal and the delayed address signal are equal; and
   a bypass control signal generating circuit for generating the bypass control signals in response to the comparison signals.

4. A semiconductor memory device according to claim 2 wherein the bypass data signals comprise a non-delayed data signal, a one cycle delayed data signal and a two cycle delayed data signal, and wherein the bypass control circuit comprises:
   a control signal generating circuit for generating control signals;
   a data input storage circuit for generating the bypass data signals from the data signal responsive to the control signals; and
   a data output selection circuit for selecting one of the bypass data signals responsive to the bypass control signals.

5. A semiconductor memory device according to claim 4, wherein the control signals comprise a first control signal, a second control signal and a third control signal, wherein the data input storage circuit further comprises:
   a first transmitting means for transmitting the data signal in response to the first control signal;
   a first latch for generating the non-delayed data signal by latching an output of the first transmitting means;
   a second transmitting means for transmitting the output of the first latch in response to an inversion of the first control signal;
   a second latch for generating the one cycle delayed data signal by latching the output of the second transmitting means;
   a third transmitting means for transmitting the one cycle delayed data signal in response to the first control signal;
   a third latch for latching an output of the third transmitting means;
   a fourth transmitting means for transmitting the output of the third latch in response to the inverted first control signal;
   a fourth latch for generating the two cycle delayed data signal by latching the output of the fourth transmitting means;
   a fifth transmitting means for transmitting the one cycle delayed data signal in response to the second control signal;
   a sixth transmitting means for transmitting the two cycle delayed data signal in response to the third control signal; and
   a fifth latch for latching a signal from the fifth or sixth transmitting means.

6. A semiconductor memory device according to claim 5 wherein the data output buffer comprises:
   an enabling means for outputting the output of the sense amplifier in response to the data output control signal;
   inverting and latching means for inverting and latching the output of the enabling means; and
   data output means for inverting the output of the inverting and latching means.

7. A semiconductor memory device according to claim 6, wherein the bypass control signals comprise a first, second, third and fourth bypass control signal and wherein the data output selection circuit comprises:
   a seventh transmitting means for transmitting the one cycle delayed data signal in response to the second bypass control signal;
   an eight transmitting means for transmitting the two cycle delayed data signal in response to the third bypass control signal;
   a sixth latch for latching the output of the seventh and eighth transmitting means;
   a ninth transmitting means for transmitting a signal to the data output means of the data output buffer, the signal latched to the first latch and inverted in response to the fourth bypass control signal; and
   a tenth transmitting means for transmitting an inversion of the non-delayed data signal to the data output means of the data output buffer in response to an inversion of the first bypass control signal NORed with a clock signal.

8. A semiconductor memory device according to claim 7, wherein the output enabling circuit comprises:
   a first NOR gate receiving signals from the enabling means of the data output buffer;
   a sense amplifier enabling means responsive to a sense amplifier enabled signal and the output of the first NOR gate;
   a second NOR gate receiving the first and fourth bypass control signals; and
   a data output control signal generating means for generating the data output control signal for controlling the sense amplifier and the data output buffer by NANDing the output of the second NOR gate and an inversion of the output of the sense amplifier enabling means.

9. A bypass circuit for bypassing a write operation in a semiconductor memory device having a memory, the bypass circuit comprising:

an address compare bypass enabling circuit for generating a delayed address signal and generating bypass control signals in response to a comparison of an address signal with the delayed address signal; and a bypass control circuit for bypassing write operations to the memory by outputting one of a plurality of bypass data signals in response to the bypass control signals.

10. A semiconductor memory device according to claim 9, wherein the address compare bypass enabling circuit generates the delayed address signal delayed by one or two cycles.

11. A semiconductor memory device according to claim 10 wherein the address compare bypass enabling circuit comprises:

a write address storage circuit for generating the delayed address signal from the address signal;

a comparison circuit for comparing the address signal and the delayed address signal and generating comparison signals when the address signal and the delayed address signal are equal; and a bypass control signal generating circuit for generating the bypass control signals in response to the comparison signals.

12. A semiconductor memory device according to claim 10 wherein the bypass data signals comprise a non-delayed data signal, a one cycle delayed data signal and a two cycle delayed data signal, and wherein the bypass control circuit comprises:

a control signal generating circuit for generating control signals;

a data input storage circuit for generating the bypass data signals from a data signal responsive to the control signals; and a data output selection circuit for selecting one of the bypass data signals responsive to the bypass control signals.

13. A semiconductor memory device according to claim 12, wherein the control signals comprise a first control signal, a second control signal and a third control signal, wherein the data input storage circuit further comprises:

a first transmitting means for transmitting the data signal in response to the first control signal;

a first latch for generating the non-delayed data signal by latching an output of the first transmitting means;

a second transmitting means for transmitting the output of the first latch in response to an inversion of the first control signal;

a second latch for generating the one cycle delayed data signal by latching the output of the second transmitting means;

a third transmitting means for transmitting the one cycle delayed data signal in response to the first control signal;

a third latch for latching an output of the third transmitting means;

a fourth transmitting means for transmitting the output of the third latch in response to the inverted first control signal;

a fourth latch for generating the two cycle delayed data signal by latching the output of the fourth transmitting means;

a fifth transmitting means for transmitting the one cycle delayed data signal in response to the second control signal;

a sixth transmitting means for transmitting the two cycle delayed data signal in response to the third control signal; and a fifth latch for latching a signal from the fifth or sixth transmitting means.

14. A semiconductor memory device according to claim 13, wherein the bypass control signals comprise a first, second, third and fourth bypass control signal and wherein the data output selection circuit comprises:

a seventh transmitting means for transmitting the one cycle delayed data signal in response to the second bypass control signal;

a eight transmitting means for transmitting the two cycle delayed data signal in response to the third bypass control signal;

a sixth latch for latching the output of the seventh and eighth transmitting means;

a ninth transmitting means for transmitting a signal to a data output buffer, the signal latched to the first latch and inverted in response to the fourth bypass control signal; and a tenth transmitting means for transmitting an inversion of the non-delayed data signal to the data output buffer in response to an inversion of the first bypass control signal NORed with a clock signal.

15. A method for bypassing a write to a semiconductor device memory comprising the steps:

initiating a write operation at a first write address with a first write data;

buffering the first write address;

buffering the first write data;

initiating a read operation at a read address;

comparing the read address with the buffered first write address and if they match generating a first bypass control signal; and if indicated by the first bypass control signal, writing the first write data to an output buffer bypassing a write to memory.

16. A method according to claim 15 wherein after the step of initiating a read operation performing the following steps:

initiating a second read operation at a second read address, comparing the second read address with the buffered first write address and if they match generating a second bypass control signal, and if indicated by the second bypass control signal, writing the first write data to an output buffer bypassing a write to memory, else writing the first write data to memory.

17. A method according to claim 15 wherein after the steps of buffering the first write address and buffering the first write data and before the step of initiating a read operation performing the following steps:

initiating a second write operation at a second write address with a second write data, buffering the second write address, and buffering the second write data;

further performing the steps:

comparing the first read address with the buffered second write address and if they match generating a third bypass control signal, and if indicated by the third bypass control signal, writing the second write data to an output buffer bypassing a write to memory, else writing the second write data to memory.

* * * * *